United States Patent
Kang et al.

(10) Patent No.: US 7,223,514 B2
(45) Date of Patent: May 29, 2007

(54) METHOD OF FABRICATING DONOR SUBSTRATE AND METHOD OF FABRICATING OLED USING THE DONOR SUBSTRATE

(75) Inventors: Tae-Min Kang, Suwon-si (KR);
Jae-Ho Lee, Suwon-si (KR);
Seong-Taek Lee, Suwon-si (KR);
Jin-Soo Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/236,494

(22) Filed: Sep. 28, 2005

(65) Prior Publication Data
US 2006/0073406 A1    Apr. 6, 2006

(30) Foreign Application Priority Data
Oct. 5, 2004    (KR) ............... 10-2004-0079250

(51) Int. Cl.
*G03F 7/34* (2006.01)
*G03F 7/16* (2006.01)

(52) U.S. Cl. ............... 430/200; 430/201; 430/935; 427/255.6; 427/282

(58) Field of Classification Search ............... 430/200, 430/201, 271.1, 935; 427/255.6, 282
See application file for complete search history.

(56) References Cited

U.S. PATENT DOCUMENTS

| | | | |
|---|---|---|---|
| 5,851,709 A | * | 12/1998 | Grande et al. ............... 430/7 |
| 5,863,860 A | * | 1/1999 | Patel et al. ............... 503/227 |
| 5,937,272 A | * | 8/1999 | Tang ............... 438/30 |
| 6,214,520 B1 | * | 4/2001 | Wolk et al. ............... 430/273.1 |
| 6,403,392 B1 | | 6/2002 | Burrows et al. |
| 2005/0112303 A1 | | 5/2005 | Kim et al. |

FOREIGN PATENT DOCUMENTS

| | | |
|---|---|---|
| EP | 0773707 | 5/1997 |
| EP | 0913870 | 5/1999 |
| KR | 10-2002-0030135 | 4/2002 |
| KR | 10-2004-0054474 | 6/2004 |
| WO | WO 02/070271 | 9/2002 |

OTHER PUBLICATIONS

Examiner Wolfbauer, G., European Search Report for European Patent Application No. EP 05109172 dated Jan. 31, 2006.

* cited by examiner

*Primary Examiner*—Richard L. Schilling
(74) *Attorney, Agent, or Firm*—Robert E. Bushnell, Esq.

(57) ABSTRACT

A method of fabricating a donor substrate and a method of fabricating an organic light emitting display (OLED) using the donor substrate. The method of fabricating the donor substrate includes preparing a base substrate that includes at least one transfer region and at least one non-transfer region, forming a light-to-heat conversion layer on the base substrate and depositing a transfer layer selectively on the light-to-heat conversion layer and in the at least one transfer region of the base substrate using a shadow mask. To then make the OLED, laser induced thermal imaging is used to transfer the patterned transfer layer from the donor substrate to display regions in an acceptor substrate.

19 Claims, 7 Drawing Sheets

FIG. 5

METHOD OF FABRICATING DONOR SUBSTRATE AND METHOD OF FABRICATING OLED USING THE DONOR SUBSTRATE

CLAIM OF PRIORITY

This application makes reference to, incorporates the same herein, and claims all benefits accruing under 35 U.S.C. §119 from an application for METHOD OF FABRICATING DONOR SUBSTRATE AND METHOD OF FABRICATING OLED USING THE DONOR SUBSTRATE earlier filed in the Korean Intellectual Property Office on 5 Oct. 2004 and there duly assigned Serial No. 2004-79250.

BACKGROUND OF THE INVENTION

1. Field of the Invention

The present invention relates to a donor substrate, a method of fabricating a donor substrate, and a method of fabricating an organic light emitting display (OLED) and, more particularly, to a method of fabricating a patterned donor substrate and a method of fabricating an OLED using the patterned donor substrate.

2. Description of the Related Art

Among flat panel displays (FPDs), an organic light emitting display (OLED) is an excellent type of FPD for displaying moving images of all sizes because the OLED has a fast response speed of 1 ms or less, consumes a small amount of power, and is an emissive type of display allowing for a wide viewing angle. Also, the OLED can be fabricated at low a temperature via a simple process based on conventional semiconductor manufacturing technology. For these reasons, the OLED has attracted much attention as the next-generation FPD.

The OLED can essentially be classified into a polymer device made by a wet process and a small molecular device made by a deposition process, according to the types of material and processes used for the emission layers of an organic light emitting diode. Two drawbacks of the inkjet wet process is that 1) organic layers other than the emission layer can essentially be formed of only limited kinds of materials, and 2) it is difficult to form a structure on a substrate using the inkjet method. A drawback of the deposition method is that it is difficult to fabricate a large-sized device using a metal mask.

As an alternative to the inkjet method and the deposition method, a laser induced thermal imaging (LITI) process has recently been developed. In the LITI process, laser beams irradiated by a light source are converted into thermal energy, and a patterned material on a donor substrate is transferred to an acceptor substrate using the thermal energy, thus forming a pattern on the acceptor substrate.

When the transfer layer of the donor substrate is transferred using the LITI process, it is transferred onto all portions of the acceptor substrate because all portions are irradiated with laser beams. Thus, the transfer layer is formed on portions of the acceptor substrate that do not need the transfer layer, such as on the encapsulation portion.

Since the transfer layer is an organic material, the presence of the transfer layer in the encapsulation portion can lead to poor adhesion of sealant in the encapsulation portion. Poor adhesion of sealant in the encapsulation portion allows external gas and moisture to be introduced into the OLED, thus shortening the lifetime of the emission layer of the OLED, leading to pixel failure. As a result, LITI produced emission layers require an extra process of removing portions of the transfer layer transferred to the encapsulation portion of the acceptor substrate.

In order to remove the transfer layer from the encapsulation portion, an additional apparatus, such as a mechanical shutter or modulator, can be installed as an on-off controller for the laser, so that the transfer layer can be patterned according to an on-off state of the laser. Also, since a modulator needs a high power laser, a significant increase in manufacturing cost is incurred. However, the mechanical shutter operates at low speed, leading to a failure in the pattern. Further, on-off operations of the laser leads to increased process time. What is needed is an improved method of making a donor substrate that prevents the transfer layer from transferring onto the encapsulation portion of the acceptor substrate while avoiding the use of an on-off controller for a laser.

SUMMARY OF THE INVENTION

It is therefore an object of the present invention to provide an improved method of making a donor substrate.

It is also an object of the present invention to provide an improved method of making an OLED display.

It is still an object of the present invention to provide a method of fabricating a donor substrate in which a transfer layer of a donor substrate is patterned only in the transfer regions, so that a process of removing a transfer layer formed on non-display portions of an acceptor substrate can be avoided.

It is further an object of the present invention to provide a method of fabricating an organic light emitting display (OLED) by using a donor substrate including a patterned transfer layer, the pattern being formed only on a display region and transferred through laser induced thermal imaging (LITI) without using an additional apparatus or process.

In an exemplary embodiment of the present invention, a method of fabricating a donor substrate includes preparing a base substrate that includes at least one transfer region and at least one non-transfer region, forming a light-to-heat conversion layer on the base substrate, and depositing a transfer layer selectively on the light-to-heat conversion layer and in the at least one transfer region of the base substrate using a shadow mask.

In another exemplary embodiment of the present invention, a method of fabricating an OLED includes forming a transfer layer selectively in a transfer region on a donor substrate using a shadow mask, the donor substrate including at least one transfer region and at least one non-transfer region, preparing an acceptor substrate including at least one display region, aligning the at least one transfer region of the donor substrate to the at least one display region of the acceptor substrate so that they are opposite to each other, and transferring the transfer layer arranged in the at least one transfer region of the donor substrate onto the at least one display region of the acceptor substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
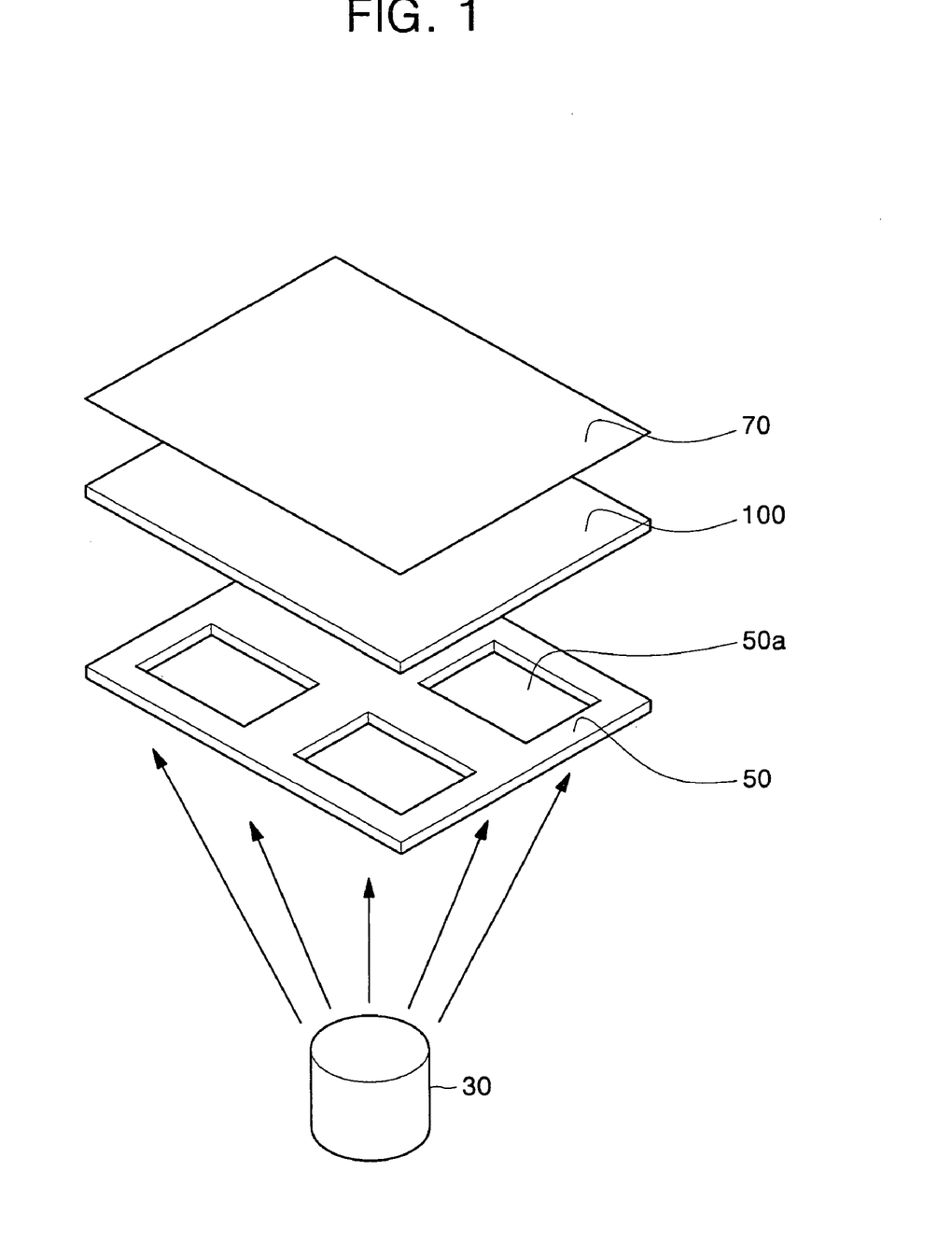
FIG. 1 is a perspective view illustrating a method of fabricating a donor substrate according to an exemplary embodiment of the present invention.

Turning now to the figures, FIG. 1 is a perspective view illustrating a method of fabricating a donor substrate according to an exemplary embodiment of the present invention. Referring to FIG. 1, a light-to-heat conversion (LTHC) layer is formed on a base substrate 100 that has at least one transfer region and at least one non-transfer region. A transfer material is deposited on the LTHC layer in the transfer region using a shadow mask 50, thus forming a transfer layer. The base substrate 100 later becomes the donor substrate that is used to donate the patterned transfer layer to an acceptor substrate.

Specifically, the LTHC layer is made of a light absorption material that absorbs light in the infrared and visible regions. The LTHC layer is made of either an organic material, a metal, or a combination thereof. The LTHC layer contains a laser absorption material. The LTHC layer serves to convert laser beams irradiated by incident laser radiation into thermal energy. This thermal energy transforms adhesion between the transfer layer and the LTHC layer allowing the transfer layer to be transferred to an acceptor substrate.

To form the transfer layer on base substrate 100, the shadow mask 50 is positioned over the base substrate 100 on which the LTHC layer is formed so that open regions 50a on shadow mask 50 correspond to the transfer regions. Then, the transfer layer is deposited onto base substrate 100 using the shadow mask 50. The transfer region is a region on base substrate 100 on which the transfer layer is formed and will be subsequently be transferred to an acceptor substrate through a laser induced thermal imaging (LITI) process.

When the base substrate 100 includes at least two transfer regions, a non-transfer region can be positioned between the two transfer regions. The transfer layer can be formed after a support plate 70 is fixed to the rear surface of the base substrate 100. The transfer layer can be an emission layer of an organic light emitting diode. Also, the transfer layer can further include at least one of a hole injection layer, a hole transport layer, a hole blocking layer, and an electron injection layer. Furthermore, a buffer layer can be formed between the base substrate 100 and the LTHC layer or between the LTHC layer and the transfer layer in order to prevent damage to the transfer material and to reinforce adhesion between the transfer layer and the donor substrate.

In such a transfer process, transfer material patterned in the transfer regions on the donor substrate is transferred via LITI to display regions on an acceptor substrate. Generally, the transfer regions on the donor substrate correspond to the display regions on the acceptor substrate. However, the width of the transfer layer formed in each of the transfer regions on the donor substrate can be designed to be slightly wider than a width of a corresponding display regions on the acceptor substrate. The difference in widths is used to compensate for either or both of alignment errors and edge effect errors.

That is, the dimension of an open region 50a of the shadow mask 50 is determined considering an alignment error that occur made when the transfer layer is transferred to the acceptor substrate. Alternatively, the dimension of the open region 50a is determined considering an edge effect, such that the transfer layer is transferred wider than the region that needs to be transferred by a thickness error of a pattern edge that can occur during the deposition of the transfer layer. Accordingly, the open region 50a of the shadow mask 50 can have a maximum value that adds the alignment error and a width for the edge effect to the pixel region. By designing the dimensions of the transfer layer as such, compensation can be made for alignment errors and/or edge effect thickness errors. In addition to compensation for such errors, transfer material is formed only in places on the acceptor substrate where it is needed (i.e., the display regions) and not on portions of the acceptor substrate where the presence of transfer material is not needed and potentially harmful (i.e., the encapsulation portion).

Figure 2:
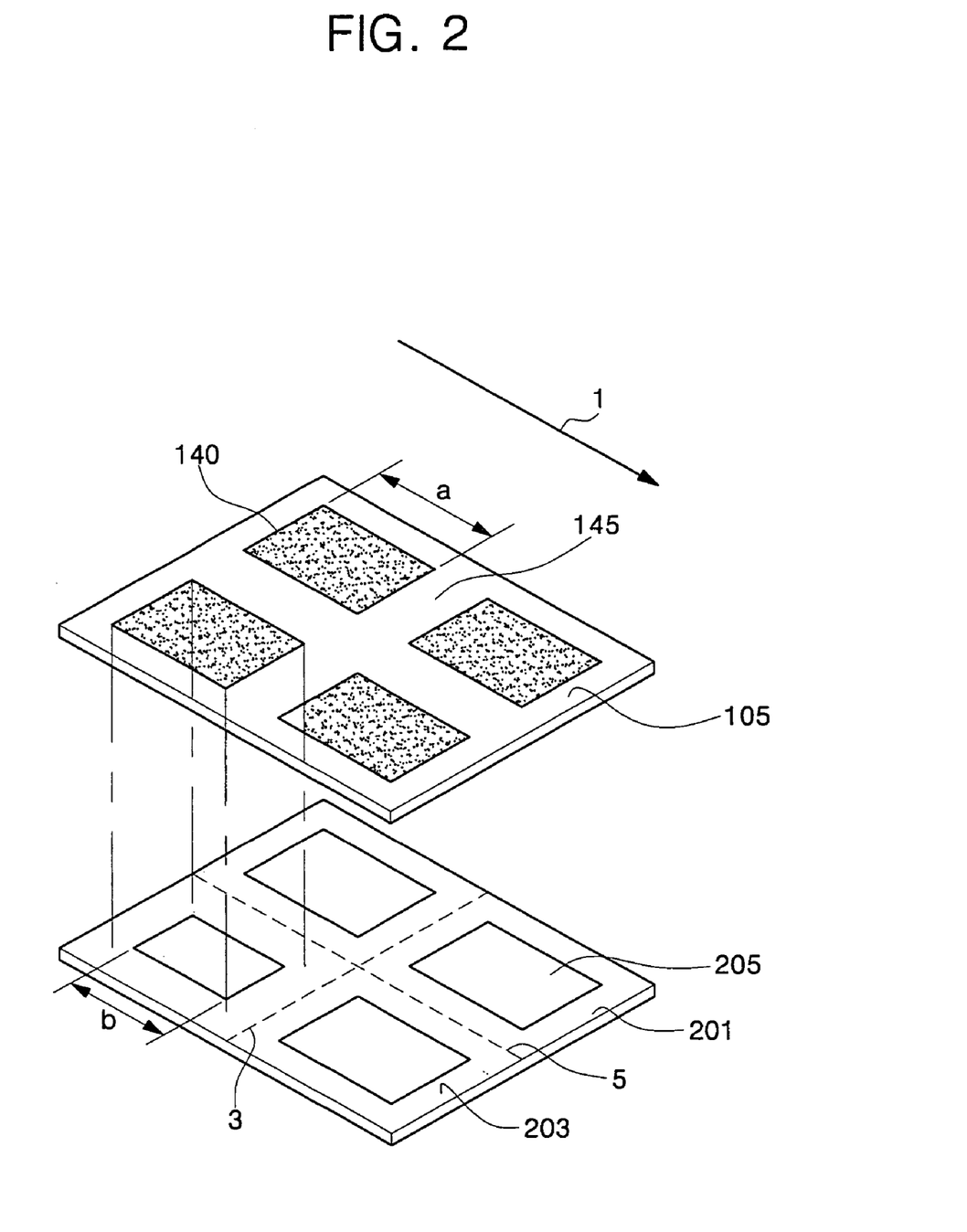
FIG. 2 is a perspective view illustrating a donor substrate and an acceptor substrate according to an exemplary embodiment of the present invention.

Turning now to FIG. 2, FIG. 2 is a view illustrating a donor substrate 105 and an acceptor substrate 201 according to an exemplary embodiment of the present invention. As illustrated in FIG. 2, the transfer layers 140 on the donor substrate 105 corresponds in pattern and location to the display regions 205 on the acceptor substrate 201.

Referring to FIG. 2, the donor substrate 105, which is fabricated as described with reference to FIG. 1, includes a transfer regions 140 and a non-transfer region 145, and a transfer layer is formed only on the transfer regions 140. In the donor substrate 105, when a base substrate includes at least two transfer regions 140, the non-transfer region 145 can be located between the transfer regions 140.

The patterned transfer layer can be made of an emission layer of an organic light emitting diode. Also, the patterned transfer layer can further include at least one of a hole injection layer, a hole transport layer, a hole blocking layer, and an electron injection layer.

The donor substrate 105 is located over acceptor substrate 201. Acceptor substrate 201 includes at least one display region 205. A LITI process is carried out to transfer the transfer layers from the donor substrate 105 to the acceptor substrate 201 resulting in the transfer layers being is formed in the display regions 205 on acceptor substrate 201. Thus, non-display region 203 located between the display regions 205 on acceptor substrate 201 does not need transfer material does not receive transfer material. This is accomplished without having to use on-off controlled lasers. In other words, even if laser beams are irradiated on the entire surface of the donor substrate 105, the transfer layer is patterned only on display regions 205 of acceptor substrate 201 where the transfer layers are needed. Therefore, a patterned transfer layer is formed on the acceptor substrate without the use of either one of a mechanical shutter that operates at lower speed than the laser or a modulator that serves to control an on-off state of the laser. Accordingly, a failure in a pattern can be prevented, and the cost of production can be reduced.

As illustrated in FIG. 2, cleave lines 3 and 5 are also formed in non-display region 203 on acceptor substrate 201. After the completion of processing, the resultant can be cleaved into a plurality if OLEDs. Thus, the present process can be used to make a plurality of OLEDs simultaneously.

Each of the transfer regions 140 on the donor substrate 105 is designed to be slightly wider than each of the corresponding display regions 205 on acceptor substrate 201 where the transfer material is to be transferred to. A difference between a width "a" of the transfer region 140 on donor substrate 105 and a width "b" of display region 205 on acceptor substrate is intentionally designed to compensate for alignment errors between the donor substrate 105 and the acceptor substrate 201 and also to compensate for thickness/edge effect errors of the transfer layer during the deposition of the transfer layer on the donor substrate 105. In other words, the maximum difference between the width "a" of the transfer region 140 on donor substrate 105 and the width "b" of the display region 205 on the acceptor substrate 201 can be obtained by adding an alignment error of a pixel region to edge effect errors.

Accordingly, when the transfer layer is patterned on the acceptor substrate 201 using a donor substrate 105, a pattern failure caused by an alignment error can be compensated for and thus prevented. Also, a failure in edge thickness, which can be made when the transfer layer is formed on the donor substrate 105, does not take place even if the transfer layer is transferred to the acceptor substrate 201. Consequently, the transfer layer can be patterned more effectively on the acceptor substrate 201.

Figure 3A:
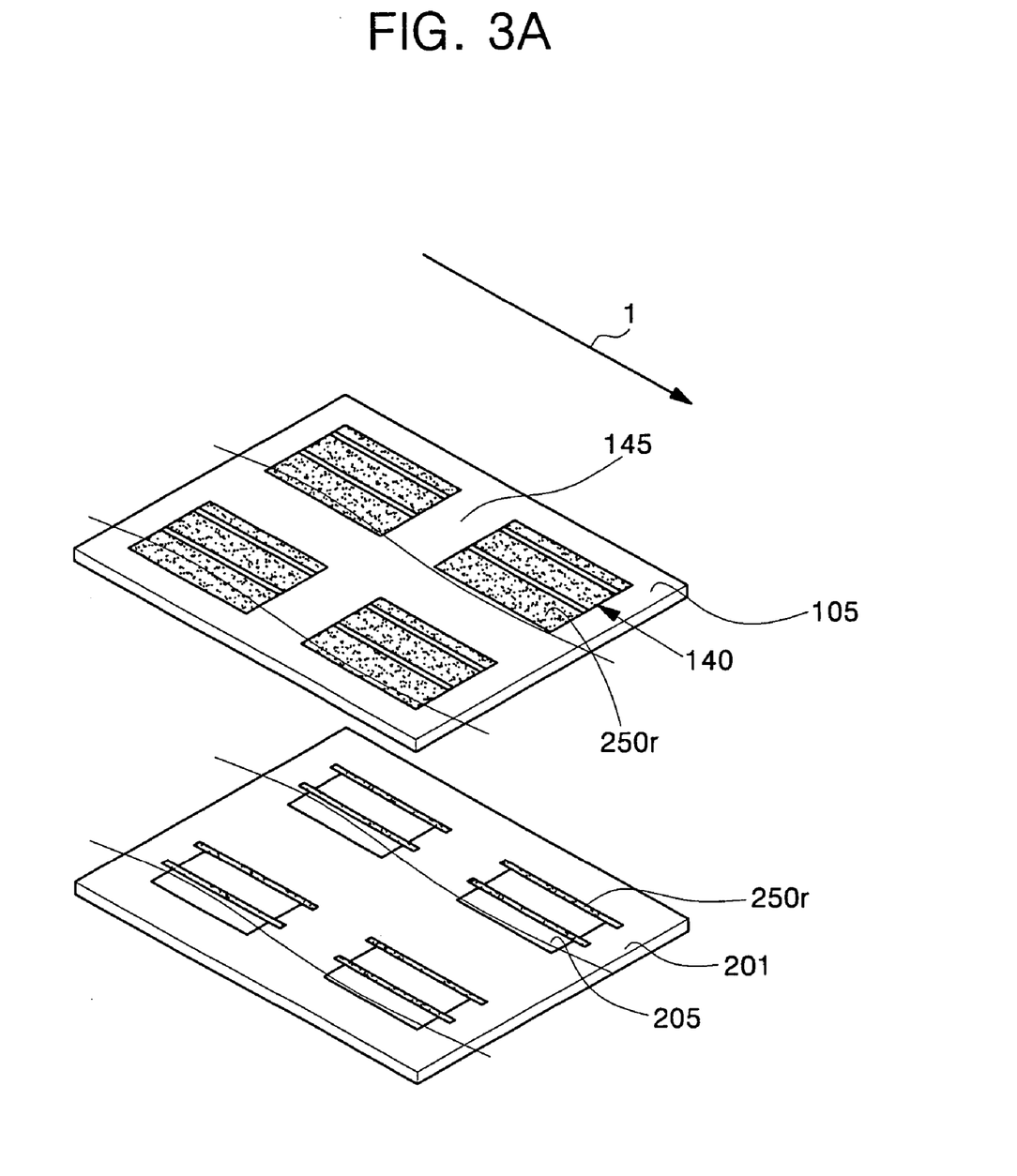
FIGS. 3A through 3C are perspective views illustrating a method of fabricating an organic light emitting display (OLED) according to an exemplary embodiment of the present invention.
Figure 3B:
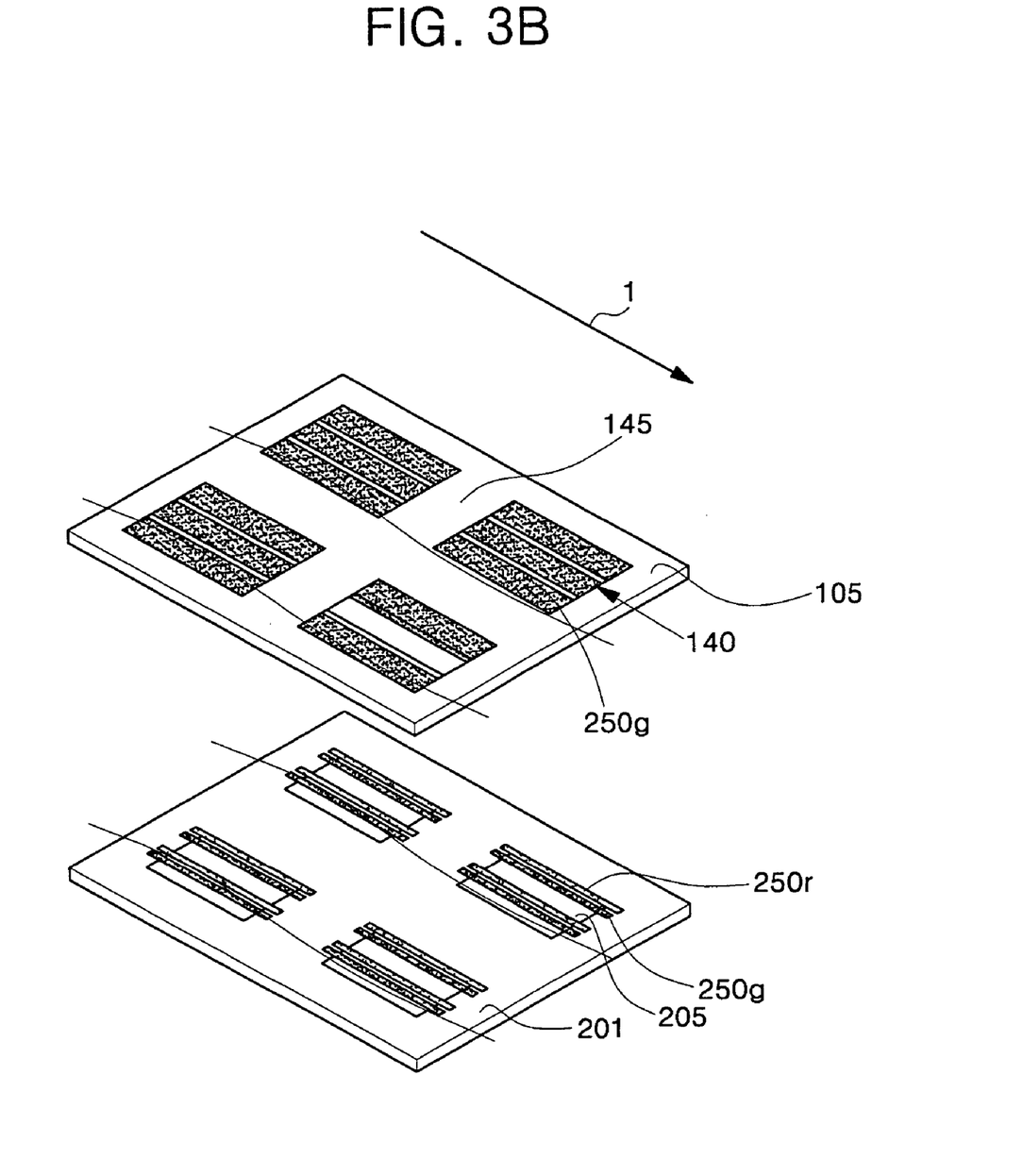
Figure 3C:
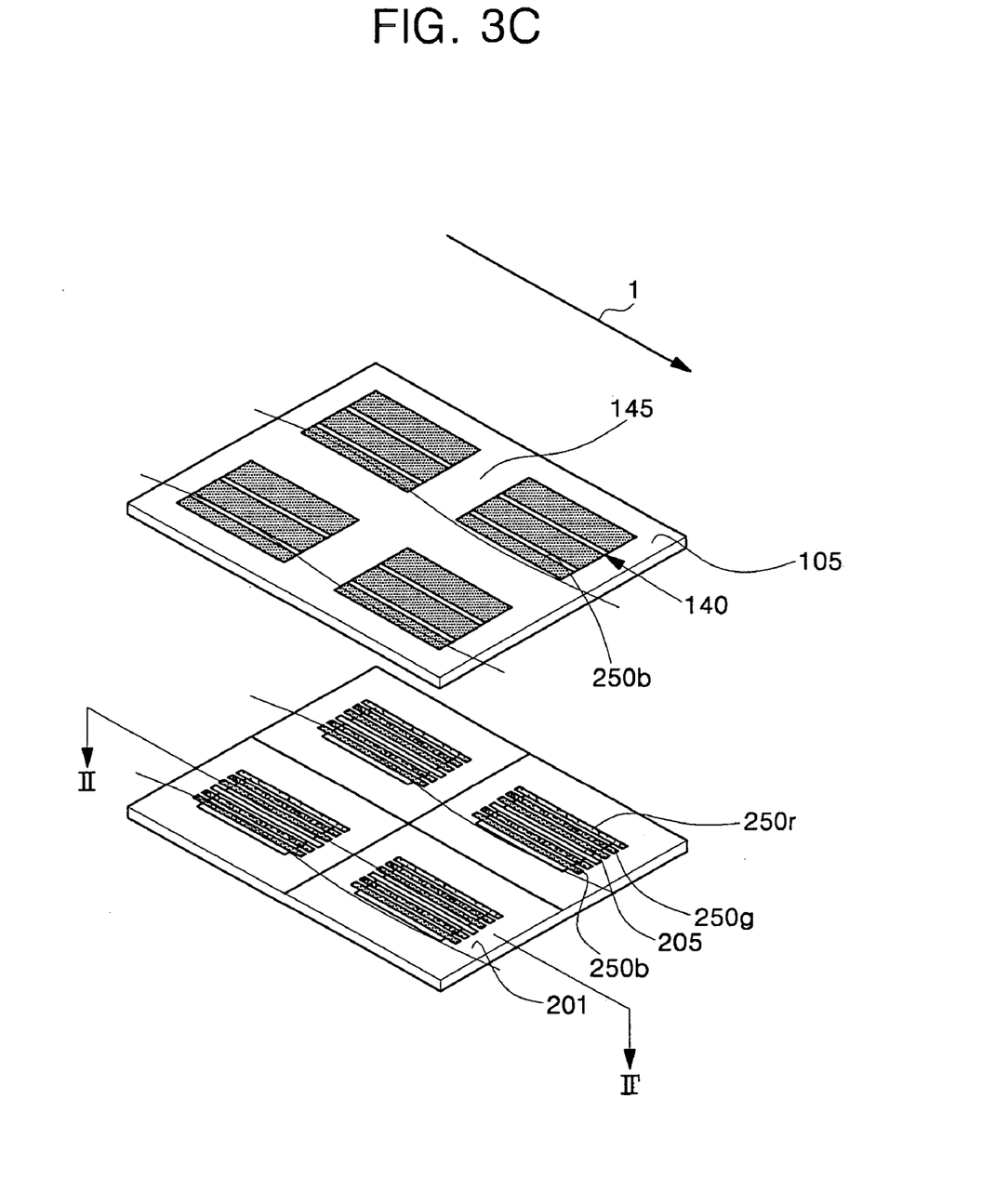

Turning now to FIGS. 3A through 3C, FIGS. 3A through 3C are perspective views illustrating a method of fabricating an OLED according to an exemplary embodiment of the present invention. The OLED is fabricated using the above-described donor substrate. Although FIGS. 3A through 3C describe a process where the transfer layer is patterned in the order of the R, G, and B unit pixel regions, it is to be appreciated that other color orders can occur and still be within the scope of the present invention.

Referring to FIGS. 3A through 3C, in each of red (R), green (G), and blue (B) unit pixels, a donor substrate 105 including transfer regions 140 and a non-transfer region 145 is prepared. On the donor substrate 105, a transfer layer is patterned within the transfer regions 140. On the donor substrate 105, when the donor substrate includes at least two transfer regions 140, the non-transfer region 145 can be located between the two transfer regions 140. The donor substrate 105 can be larger than the acceptor substrate 201. Also, the donor substrate 105 can further include a buffer layer interposed between the transfer layer and an LTHC layer or between the base substrate and the LTHC layer.

Referring to FIG. 3A, the acceptor substrate 201 includes at least one display region 205, each display region 205 being aligned and opposite to corresponding transfer regions 140 formed on donor substrate 105. The transfers regions 140 can contain transfer layers that can include an emission layer. Also, the transfer layer can further include at least one of a hole injection layer, a hole transport layer, a hole blocking layer, and an electron injection layer.

The donor substrate 105 includes at least one transfer region 140 and a non-transfer region 145, and an R transfer layer 250r made of an R (red) emission material is selectively formed on the transfer region 140 using a shadow mask. The donor substrate 105 on which the R emission layer 250r is formed is aligned with and located over the display region 205 of acceptor substrate 201. Thereafter, the patterned R emission layer 250r is transferred onto the display region 205 of the substrate 201 via a LITI process. The transfer layer 250r can be transferred onto the display region 205 of acceptor substrate 201 by irradiating continuous-wave (CW) laser beams 1 onto the donor substrate 105. As a result, the R emission layer 250r is formed in an R unit pixel regions in display region 205 on the acceptor substrate 201.

Referring now to FIG. 3B, by using the donor substrate 105 on which a G (green) emission layer is patterned, a G emission layer 250g is transferred to G unit pixel region on the display region 205 on acceptor substrate 201 on which the R emission layer 250r is formed, in the same manner as described with reference to FIG. 3A. Similarly, referring to FIG. 3C, a B (blue) emission layer 250b is transferred to a B unit pixel region on the display region 205 of acceptor substrate 201 using the donor substrate 105 on which a B emission layer is patterned, in the same manner as described with reference to FIGS. 3A and 3B.

By using a donor substrate 105 on which an transfer layer containing the emission material is patterned, the occurrence of transferring emission material to portions of the acceptor substrate that do not need the transfer layer, such as the encapsulation portion, can be avoided. Thus, a process of removing emission material from portions of the acceptor substrate outside of the display regions can be avoided. Also, since laser irradiation is continuously performed, it is unnecessary to adopt an on-off controller for discontinuous laser irradiation to pattern the transfer layer. Accordingly, the cost of production is reduced. Further, an organic layer is not present in the encapsulation portion so that deterioration of the adhesive properties of the sealant applied can be avoided.

Another feature of the present invention is that the patterned emission layers 250r, 250g, and 250b are formed to be slightly larger than the display regions 205. The patterned region of the emission layer (i.e., the transfer region 140 on the donor substrate 105) can be formed wider than the display region 205 on acceptor substrate 201 to compensate for alignment errors. Thus, even if the emission layer on the donor substrate 105 is patterned, a pattern failure caused by an alignment error between the donor substrate 105 and the acceptor substrate 201 can be prevented.

Also, the transfer region 140 of the donor substrate 105 can further be formed wider than the display region 205 on acceptor substrate 201 to compensate for an edge effect. As a result, failures in edge thickness that can occur when the transfer layer is formed on the donor substrate 105, does not occur even when the transfer layer is transferred on the acceptor substrate 201 because of the compensation. As a result, the transfer layer can be patterned more effectively.

Figure 4:
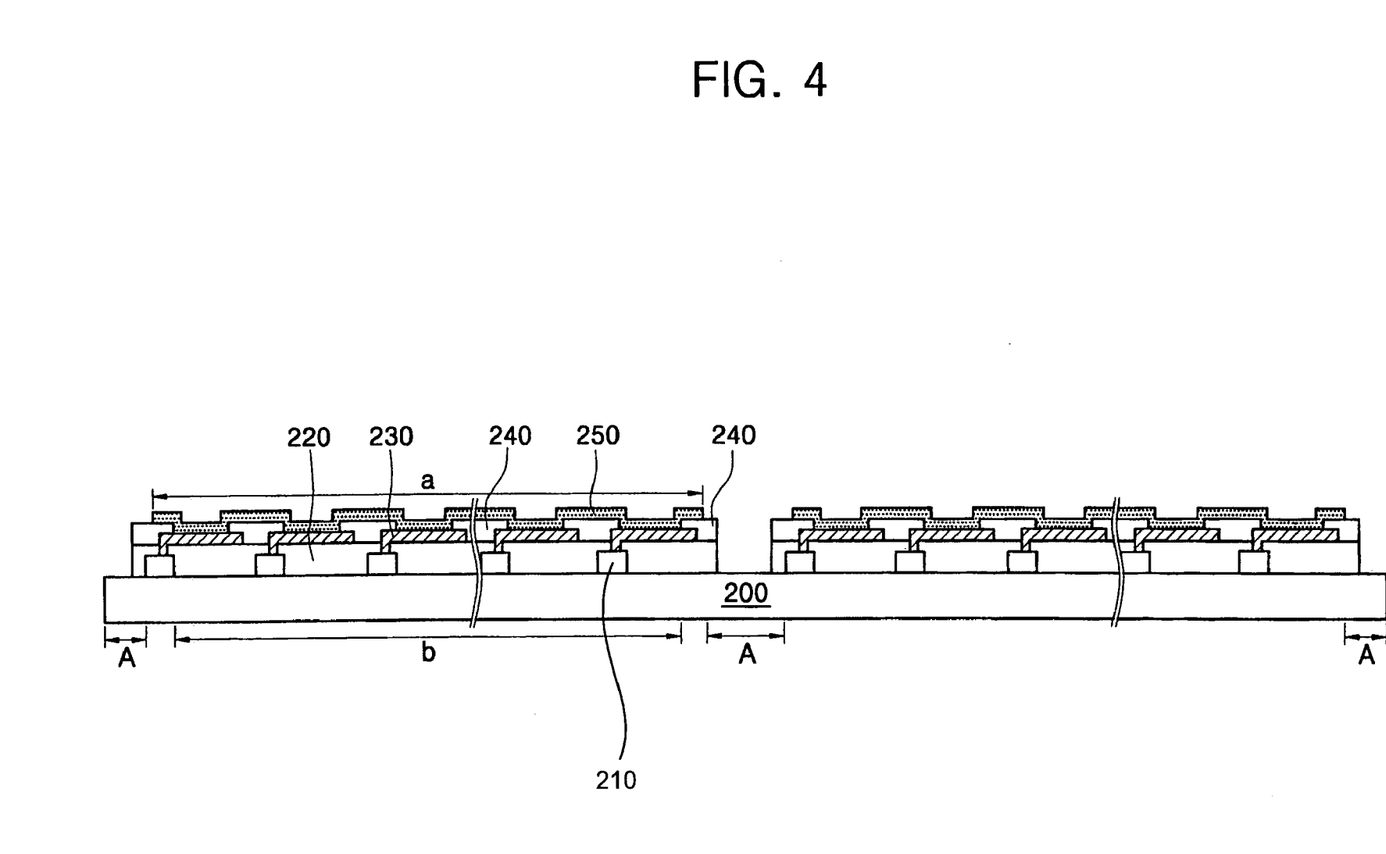
FIGS. 4 and 5 are cross-sectional views illustrating a method of fabricating an OLED according to an exemplary embodiment of the present invention.
Figure 5:
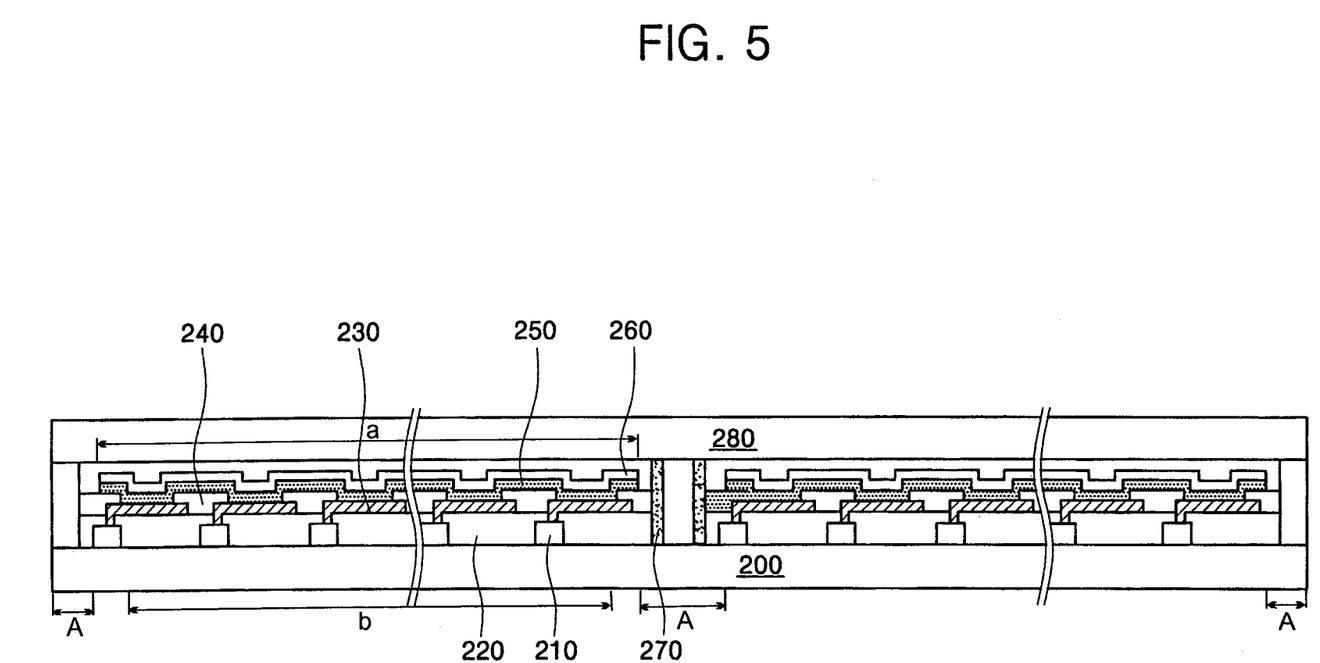

Turning now to FIGS. 4 and 5, FIGS. 4 and 5 are the cross sectional views are taken along line II–II' of FIG. 3C illustrating a method of fabricating an OLED using the above-described donor substrate according to an exemplary embodiment of the present invention. Although FIG. 3C shows the presence of three colors of emission material formed within each display region on acceptor substrate, FIGS. 4 and 5 instead correspond to unit pixels in any one color.

Referring to FIG. 4, a predetermined layer including thin film transistors (TFTs) 210 is formed on a lower substrate 200 in at least one display region "b". Specifically, a gate electrode, a source electrode, and a drain electrode are formed on the lower substrate 200. In addition to the TFTs 210, a capacitor or metal interconnections are formed. An insulating layer 220 is formed on the resultant structure. Insulating layer 220 can include a gate insulating layer and an interlayer insulating layer. Insulating layer can further include a passivation layer or a planarization layer. Thus, the TFTs 210 and the insulating layer 220 are formed in each of the unit pixel regions of the lower substrate 200.

Pixel electrodes 230 are formed so that they are connected to the TFTs 210. In order to improve luminous efficiency, a reflection layer can be interposed between the pixel electrodes 230 and the insulating layer 220. A pixel defining layer 240 is formed on the pixel electrodes 230 on the lower substrate 200 to define each of the unit pixel regions.

An emission layer 250 is formed on the pixel defining layer 240 using the donor substrate in the same manner as described above. By using the donor substrate on which an emission layer is patterned, the emission layer is not transferred to encapsulation portions "A" where the presence of emission material is not needed and can be harmful. As described above, a region "a" of the patterned emission layer 250 is formed wider than a display region "b" to compensate for alignment and edge thickness errors. As a result, the emission layer 250 can be patterned more effectively.

Referring now to FIG. 5, an opposite electrode 260 is formed on the lower substrate 200 on which the emission layer 250 is formed. Thereafter, a sealant 270 is formed on every encapsulation portion "A" between the display regions "b". The resultant structure is then encapsulated using an upper substrate 280, and the encapsulated structure is severed into respective display devices. As a result, the formation of one or more OLEDs is completed.

According to the present invention, a transfer layer on a donor substrate is patterned and formed only in a transfer region. By doing so, there is no need to employ a process of removing transfer material from regions outside of the transfer region. Also, because no organic material is formed in the encapsulation portion, deterioration of adhesive properties of sealant applied in the encapsulation portion can be avoided. Further, by using the donor substrate including the patterned transfer layer, a pattern can be formed only in a display region during an LITI process without using any additional on-off controller for a laser.

Moreover, the patterned transfer layer on the donor substrate is formed to be slightly wider than the display region of the OLED. Accordingly, a pattern failure caused by an alignment error between the donor substrate and the acceptor substrate can be prevented, and a failure in edge thickness, which can be made when the transfer layer is formed on the donor substrate, can also be prevented even when the transfer layer is transferred to the acceptor substrate. As a result, the transfer layer can be patterned more effectively.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A method, comprising:
    preparing a base substrate that includes a plurality of transfer regions and at least one non-transfer region arranged between the plurality of transfer regions;
    forming a light-to-heat conversion layer on the base substrate;
    depositing a transfer layer selectively on the light-to-heat conversion layer in the plurality of transfer regions of the base substrate using a shadow mask; and
    placing an acceptor substrate opposite to the base substrate, the acceptor substrate having a plurality of display regions that correspond to the plurality of transfer regions, wherein the transfer layer arranged in each of said transfer regions is wider than corresponding ones of the plurality of display regions, wherein each of said display regions corresponds to an entire display area for an organic light emitting display.

2. The method of claim 1, further comprising fixing a support plate to a rear surface of the base substrate prior to said forming said selective transfer layer.

3. The method of claim 1, wherein the at least one transfer region comprises at least two transfer regions, and the at least one non-transfer region is arranged between the at least two transfer regions.

4. The method of claim 1, wherein the transfer layer comprises an emission layer of an organic light emitting diode.

5. The method of claim 4, wherein the transfer layer further comprises at least one layer selected from the group consisting of a hole injection layer, a hole transport layer, a hole blocking layer, and an electron injection layer.

6. The method of claim 1, further comprising a buffer layer arranged between the base substrate and the light-to-heat conversion layer.

7. The method of claim 1, further comprising a buffer layer arranged between the light-to-heat conversion layer and the transfer layer.

8. A method of fabricating a plurality of organic light emitting displays, comprising:
    providing a donor substrate comprising a plurality of transfer regions and at least one non-transfer region separating ones of the plurality of transfer regions from each other;
    forming a transfer layer selectively in each of the plurality of transfer regions on the donor substrate using a shadow mask;
    preparing an acceptor substrate including a plurality of display regions that correspond to the plurality of transfer regions;
    aligning the plurality of transfer regions of the donor substrate to the plurality of display regions of the acceptor substrate so that they are opposite to each other;
    transferring the transfer layer arranged in the plurality of transfer regions of the donor substrate onto the plurality of display regions of the acceptor substrate via laser induced thermal imaging;
    cleaving the acceptor substrate into the plurality of organic light emitting displays by using cleave lines arranged in a non-display region of the acceptor substrate;
    applying sealant around the display regions of each the plurality of organic light emitting displays; and
    sealing each of the plurality of organic light emitting displays by attaching an upper substrate to the sealant on each of the plurality of organic light emitting displays.

9. The method of claim 8, wherein the transfer layer arranged in each transfer region of the donor substrate is formed to be wider corresponding ones of the display regions of the acceptor substrate.

10. The method of claim 8, wherein the laser induced thermal imaging is achieved by a continuous wave laser beam and not by a pulsating laser beam.

11. The method of claim 8, wherein the donor substrate is larger than the acceptor substrate.

12. The method of claim 8, wherein the donor substrate further includes a buffer layer.

13. The method of claim 8, wherein the transfer layer comprises an emission layer.

14. The method of claim 13, wherein the transfer layer further comprises at least one layer selected from the group consisting of a hole injection layer, a hole transport layer, a hole blocking layer, and an electron injection layer.

15. A method of fabricating a plurality of organic light emitting displays, comprising:
- providing a donor substrate including a plurality of transfer regions and a non-transfer region arranged between ones of the plurality of transfer regions, each transfer region corresponding to an entire display of one of said organic light emitting displays;
- forming a light-to-heat conversion layer on the donor substrate; and
- depositing a patterned transfer layer onto the light to heat conversion layer in the plurality of transfer regions using a mask, the transfer layer being essentially absent from the non-transfer region;
- aligning an acceptor substrate including a plurality of display regions to the donor substrate so that ones of the display regions on the acceptor substrate correspond to ones of the plurality of transfer regions on the donor substrate; and
- transferring the transfer layer arranged in each of the transfer regions of the donor substrate onto the display regions of the acceptor substrate via laser induced thermal imaging.

16. The method of claim 15, the transfer layer comprising emission material for an organic light emitting diode, said laser induced thermal imaging being accomplished using continuous wave laser radiation and not via pulsed laser radiation and not via on/off laser radiation, the acceptor substrate further including a non-display region outside of the plurality of display regions, the non-display region being essentially absent of the transfer layer.

17. The method of claim 15, each transfer region being larger than each display region.

18. The method of claim 15, further comprising cleaving the acceptor substrate into the plurality of organic light emitting displays by using cleave lines arranged in the non-display region of the acceptor substrate.

19. The method of claim 18, further comprising encapsulating the display region of each of the organic light emitting displays by:
- applying sealant about each display region of each of the plurality of organic light emitting displays; and
- sealing each display region each of the plurality of organic light emitting displays by attaching an upper substrate to the sealant on each of the plurality of organic light emitting dispays.

* * * * *